(12) United States Patent
Chun et al.

(10) Patent No.: US 10,063,141 B2
(45) Date of Patent: Aug. 28, 2018

(54) SYSTEM AND METHOD OF CORRECTING OUTPUT VOLTAGE SENSING ERROR OF LOW VOLTAGE DC-DC CONVERTER

(71) Applicant: Hyundai Motor Company, Seoul (KR)

(72) Inventors: Shin Hye Chun, Jeollanam-do (KR); Gi Bong Son, Gyeonggi-do (KR); Hyun Wook Seong, Gyeonggi-do (KR)

(73) Assignee: Hyundai Motor Company, Seoul (KR)

( * ) Notice: Subject to any disclaimer, the term of this patent is extended or adjusted under 35 U.S.C. 154(b) by 13 days.

(21) Appl. No.: 15/287,663

(22) Filed: Oct. 6, 2016

(65) Prior Publication Data
US 2017/0324320 A1  Nov. 9, 2017

(30) Foreign Application Priority Data
May 4, 2016  (KR) .................. 10-2016-0055314

(51) Int. Cl.
| H02M 3/04 | (2006.01) |
| G01R 19/165 | (2006.01) |
| H03K 7/08 | (2006.01) |
| H02M 3/00 | (2006.01) |
| H02M 1/00 | (2006.01) |

(52) U.S. Cl.
CPC ........ *H02M 3/04* (2013.01); *G01R 19/16576* (2013.01); *H02M 3/00* (2013.01); *H03K 7/08* (2013.01); *H02M 2001/0025* (2013.01)

(58) Field of Classification Search
CPC ...... H02M 3/155–3/1588; H02M 3/04; H02M 2001/0025; H03K 7/08
See application file for complete search history.

(56) References Cited

U.S. PATENT DOCUMENTS

| 5,652,526 | A | * | 7/1997 | Sullivan | ................. | G01R 31/34 |
| | | | | | | 318/490 |
| 6,339,340 | B1 | * | 1/2002 | Hsu | .................... | G01R 31/3648 |
| | | | | | | 324/429 |
| 6,774,612 | B1 | * | 8/2004 | Ballenger | ............. | H02M 3/156 |
| | | | | | | 323/273 |

(Continued)

FOREIGN PATENT DOCUMENTS

| JP | H11113252 A | 4/1999 |
| JP | 2001-229981 A | 8/2001 |

(Continued)

*Primary Examiner* — Yusef A Ahmed
(74) *Attorney, Agent, or Firm* — Mintz Levin Cohn Ferris Glovsky and Popeo, P.C.; Peter F. Corless (57) ABSTRACT

A method of adjusting an output voltage sensing error of a low voltage DC-DC converter to adjust a difference between a value obtained by sensing an output voltage of a low voltage DC-DC converter and a reference value controlling the low voltage DC-DC converter, thereby improving control accuracy is provided. The method of correcting an output voltage sensing error of a low voltage DC-DC converter includes applying a test voltage to an output of the LDC by voltage application equipment, sensing a voltage of the output of the LDC by a voltage sensing circuit and adjusting by a controller a voltage reference map included in an LDC controller that outputs a voltage reference value of the LDC, based on an error between the test voltage and a voltage sensing value sensed by the voltage sensing circuit.

7 Claims, 6 Drawing Sheets

(56) References Cited

U.S. PATENT DOCUMENTS

| | | | |
|---|---|---|---|
| 6,919,715 B2* | 7/2005 | Muratov | G06F 1/26 323/283 |
| 7,821,246 B2* | 10/2010 | Koertzen | H02J 1/102 323/283 |
| 8,981,829 B1* | 3/2015 | Bulzacchelli | G05F 1/625 327/306 |
| 9,054,597 B2* | 6/2015 | Zhao | H02M 1/4225 |
| 9,207,731 B2* | 12/2015 | Chang | G06F 1/206 |
| 9,692,331 B2* | 6/2017 | Brown | |
| 9,929,644 B2* | 3/2018 | Kim | H02M 3/07 |
| 2003/0001593 A1* | 1/2003 | Kronrod | G01R 1/203 324/699 |
| 2007/0229040 A1* | 10/2007 | Inoue | H02J 1/06 323/222 |
| 2008/0224683 A1* | 9/2008 | Huang | B23K 11/258 323/318 |
| 2009/0167282 A1* | 7/2009 | Koertzen | H02J 1/102 323/318 |
| 2010/0141230 A1* | 6/2010 | Lukic | H02M 3/157 323/283 |
| 2011/0101937 A1* | 5/2011 | Dobkin | H02M 3/156 323/282 |
| 2013/0176762 A1* | 7/2013 | Seymour | H02M 7/53871 363/132 |
| 2013/0200869 A1* | 8/2013 | Sasao | G05F 1/46 323/282 |
| 2013/0249518 A1* | 9/2013 | Giannopoulos | H02M 3/156 323/284 |
| 2013/0335045 A1* | 12/2013 | Zhang | H02M 3/158 323/271 |
| 2014/0268924 A1* | 9/2014 | Tang | H02M 3/33507 363/21.17 |
| 2014/0327467 A1* | 11/2014 | Diewald | G01R 31/40 324/764.01 |
| 2015/0138857 A1* | 5/2015 | Ye | H02M 1/4225 363/89 |
| 2015/0171725 A1* | 6/2015 | Park | H02M 1/08 323/301 |
| 2015/0188438 A1* | 7/2015 | Kim | H02M 3/33576 307/9.1 |
| 2016/0181866 A1* | 6/2016 | Moeskops | H02J 13/00 710/313 |
| 2016/0190912 A1* | 6/2016 | Lim | G01R 21/006 363/84 |
| 2016/0195580 A1* | 7/2016 | Zeng | G01R 31/40 324/750.01 |
| 2016/0231378 A1* | 8/2016 | Abhishek | G01R 31/2884 |
| 2016/0303993 A1* | 10/2016 | Kim | B60L 11/1868 |
| 2017/0054372 A1* | 2/2017 | Kim | H02M 3/07 |
| 2017/0136913 A1* | 5/2017 | Yang | B60L 11/1811 |
| 2017/0144556 A1* | 5/2017 | Kim | B60L 11/1803 |
| 2017/0151877 A1* | 6/2017 | Chun | B60L 11/1811 |
| 2017/0158058 A1* | 6/2017 | Lee | B60L 11/1811 |
| 2017/0170719 A1* | 6/2017 | Bang | B60L 11/1803 |
| 2017/0302155 A1* | 10/2017 | Takagaki | H02M 3/156 |

FOREIGN PATENT DOCUMENTS

| | | |
|---|---|---|
| JP | 2010-252591 A | 11/2010 |
| JP | 2015-177702 A | 10/2015 |
| JP | 2016-052242 A | 4/2016 |
| KR | 10-0967785 B1 | 7/2010 |

\* cited by examiner

FIG. 1

RELATED ART

SYSTEM AND METHOD OF CORRECTING OUTPUT VOLTAGE SENSING ERROR OF LOW VOLTAGE DC-DC CONVERTER

CROSS-REFERENCE TO RELATED APPLICATION

This application claims the priority benefit of Korean Patent Application No. 10-2016-0055314, filed on May 4, 2016, in the Korean Intellectual Property Office, the disclosure of which is incorporated herein by reference.

BACKGROUND

1. Field of the Invention

The present invention relates to a method and system of correcting an output voltage sensing error of a low voltage direct current to direct current (DC-DC) converter, and more particularly, to correcting an output voltage sensing error of a low voltage DC-DC converter to adjust a difference between a value obtained by sensing an output voltage of a low voltage DC-DC converter and a reference value to adjust the low voltage DC-DC converter, thereby improving control accuracy.

2. Description of the Related Art

A low voltage DC-DC converter (LDC) is an element that reduces a high voltage to a low voltage, charges a low-voltage battery (or subsidiary battery) with the low voltage and supplies power to electrical components of a an environmentally friendly vehicle. The LDC is adjusted to follow a voltage reference value provided by an LDC controller (microcomputer) to output a voltage. More specifically, the LDC controller is configured to output a voltage reference value to determine an output voltage of the LDC. A pulse width modulation (PWM) driver (PWM IC) to operate a switching element disposed in the LDC to receive the voltage reference value and a value obtained by sensing the output voltage of the LDC and adjusts the value based on the voltage reference value.

In particular, a factor that determines control accuracy of the output voltage may be determined by LDC output voltage sensing accuracy (e.g., a resistance error), resolution of the voltage reference value (which is related to the performance of the microcomputer that implements the LDC controller) and a degree of loss due to parasitic impedance components of a bus bar of an LDC output. For example, in digital control, LDC output voltage sensing accuracy may be improved by correcting a scale or offset value per sample with respect to a reference value at the end of a line. In the case of analog control, however, it is difficult to improve accuracy of an output voltage sensing value input to an analog IC unless resistance error in a circuit for sensing the output voltage is corrected. In other words, improved sensing accuracy in analog control is difficult to achieve unless hardware of the output voltage sensing circuit is adjusted to a new sensing circuit having a minimal resistance error, which increases costs.

Recently, various countries have developed strict requirements for LDC voltage control errors through authentication requirements related to LDC control of environmentally friendly vehicles and provide subsidies and tax benefits when authentication is achieved by satisfying such requirements. Therefore, research and development for LDC control accuracy improvement are needed.

The matters disclosed in this section are merely for enhancement of understanding of the general background of the invention and should not be taken as an acknowledgment or any form of suggestion that the matters form the related art already known to a person skilled in the art.

SUMMARY

The present invention provides a method of adjusting an output voltage sensing error of an LDC, which adjusts a difference between a value obtained by sensing an output voltage of a low voltage DC-DC converter and a reference value for operating the low voltage DC-DC converter to improve control accuracy.

In accordance with the present invention, the above and other objects can be accomplished by the provision of a method of correcting an output voltage sensing error of a low voltage DC-DC converter (LDC), that may include voltage application equipment configured to apply a test voltage to an output of the LDC; a voltage sensing circuit provided to the output of the LDC configured to sense a voltage of the output of the LDC and a controller configured to adjust a voltage reference map included in an LDC controller to output a voltage reference value of the LDC, based on an error between the test voltage and a voltage sensing value sensed by the voltage sensing circuit.

The method may further include comparing the error between the test voltage and the voltage sensing value with a predetermined reference value and determining that the voltage sensing circuit operates abnormally when the error is greater or smaller than the reference value. The application of the test voltage may include the voltage application equipment configured to apply a first test voltage and a second test voltage having different values to the output of the LDC. The sensing of the voltage of the output of the LDC may include the voltage sensing circuit configured to sense the first test voltage and the second test voltage. The adjustment of the voltage reference map may include determining output characteristics of the voltage sensing circuit by applying linear interpolation to the first and second test voltages and voltage sensing values obtained by sensing the first and second test voltages and correcting the voltage reference map based on the determined output characteristics of the voltage sensing circuit.

The LDC controller may be configured to output a PWM signal having a duty that corresponds to a voltage reference value with reference to the voltage reference map to operate the LDC. The voltage reference map may include a data map that stores the voltage reference value and the PWM signal duty that corresponds to the voltage reference value.

The correcting of the voltage reference map may include an adjustment of the PWM signal duty that corresponds to the voltage reference value in the voltage reference map. The adjustment of the voltage reference map may include calculating an error between the determined output characteristics of the voltage sensing circuit and ideal output characteristics of the voltage sensing circuit to generate a voltage reference correction value and calculating a duty correction value of the PWM signal that corresponds to the voltage reference correction value to adjust the PWM signal duty that corresponds to the voltage reference value in the voltage reference map.

In accordance with another aspect of the present invention, a method of adjusting an output voltage sensing error of an LDC may include voltage application equipment configured to apply a first test voltage and a second test voltage having different values to an output of the LDC, a voltage sensing circuit provided to the output of the LDC sensing a voltage of the output of the LDC, and a controller configured to determine output characteristics of the voltage sensing circuit by applying linear interpolation to the first and second test voltages and voltage sensing values obtained by respectively sensing the first and second test voltages and an adjustment of a voltage reference map included in an LDC controller configured to output a voltage reference value of the LDC based on an error between the determined output characteristics of the voltage sensing circuit and ideal output characteristics of the voltage sensing circuit. The LDC controller may be configured to output a PWM signal having a duty that corresponds to a voltage reference value with reference to the voltage reference map to adjust the LDC. The voltage reference map may be a data map configured to store the voltage reference value and the PWM signal duty that corresponds to the voltage reference value.

The correcting of the voltage reference map may include calculating an error between the determined output characteristics of the voltage sensing circuit and ideal output characteristics of the voltage sensing circuit to generate a voltage reference correction value and calculating a duty correction value of the PWM signal, that corresponds to the voltage reference correction value to correct the PWM signal duty that corresponds to the voltage reference value in the voltage reference map.

According to the method of adjustment of an output voltage of an LDC having the aforementioned technical features, a sensing error generated in a voltage sensing circuit for sensing the output voltage of the LDC may be adjusted in a software manner without replacing or changing the hardware of the voltage sensing circuit. Accordingly, the present invention may improve control accuracy of the LDC without an increase in costs and may meet LDC control standards for various environmentally friendly vehicles as required in many countries.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION

Hereinafter, the exemplary embodiment of the present invention will be described in detail with reference to the accompanying drawings to allow those skilled in the art to easily practice the present invention. Advantages and features of the present invention and methods for achieving the same will be clearly understood with reference to the following detailed description of embodiments in conjunction with the accompanying drawings. However, the present invention is not limited to the embodiments disclosed herein, but may be implemented in various different forms. The embodiments are merely given to make the disclosure of the present invention complete and to completely instruct the scope of the invention to those skilled in the art, and the present invention should be defined by the scope of the claims.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, in order to make the description of the present invention clear, unrelated parts are not shown and, the thicknesses of layers and regions are exaggerated for clarity. Further, when it is stated that a layer is "on" another layer or substrate, the layer may be directly on another layer or substrate or a third layer may be disposed therebetween.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It is understood that the term "vehicle" or "vehicular" or other similar term as used herein is inclusive of motor vehicle in general such as passenger automobiles including sports utility vehicles (SUV), buses, trucks, various commercial vehicles, watercraft including a variety of boats, ships, aircraft, and the like and includes hybrid vehicles, electric vehicles, combustion, plug-in hybrid electric vehicles, hydrogen-powered vehicles and other alternative fuel vehicles (e.g. fuels derived from resources other than petroleum).

A description will be given of a method of correcting an output voltage sensing error of an LDC according to various exemplary embodiments of the present invention with reference to the attached drawings.

Figure 1:
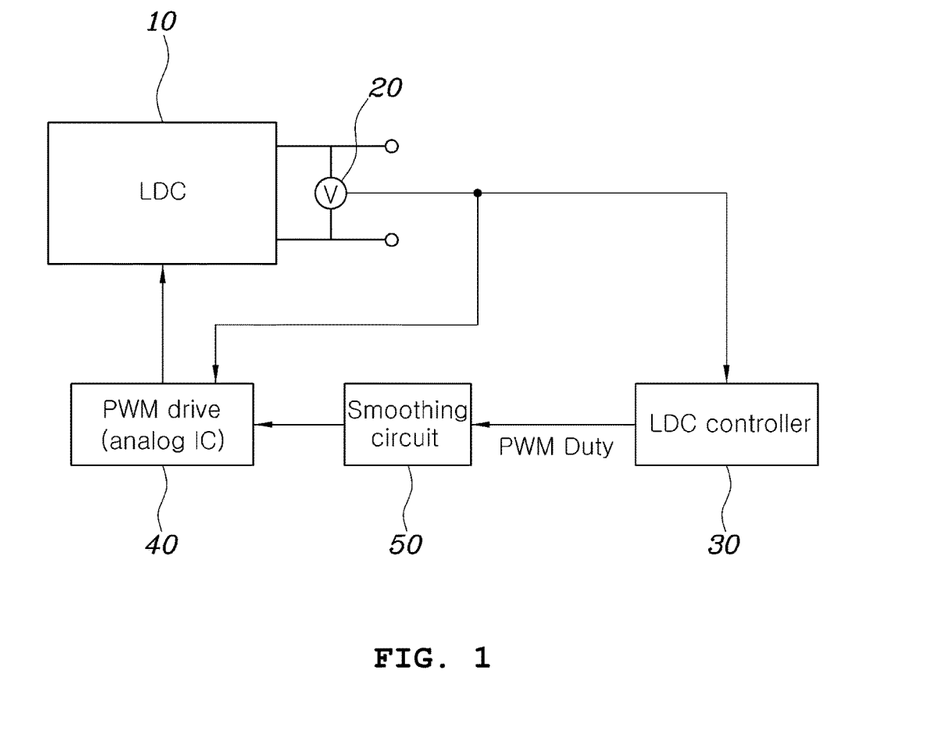
FIG. 1 is an exemplary block diagram of an LDC control system to which a method of correcting an output voltage of an LDC according to various exemplary embodiments of the present invention is applied.

FIG. 1 is an exemplary block diagram of an LDC control system to which a method of correcting an output voltage of an LDC according to various exemplary embodiments of the present invention may be applied. Referring to FIG. 1, the LDC control system may include an LDC 10, a voltage sensing circuit 20 configured to sense an output voltage of the LDC 10, an LDC controller 30 configured to output a voltage reference value to determine the output voltage of the LDC 10, and a PWM driver 40 configured to output a PWM driving signal to adjust a switching element included in the LDC 10 based on the voltage reference value output from the LDC controller 30 and the output voltage of the LDC 10, sensed by the voltage sensing circuit 20, to drive the LDC 10.

The LDC 10 may be a DC-DC step-down converter configured to receive a high DC voltage, convert the DC voltage into a low DC voltage and output the low DC voltage and may be implemented in various known forms. The LDC 10 may include a switching element and the output voltage thereof may be determined by an adjustment of on/off duty of the switching element. The switching element of the LDC 10may be driven by a PWM driving signal output from the PWM driver 40.

The voltage sensing circuit 20 may be implemented as various electric/electronic elements. The voltage sensing circuit 20 divides the output voltage of the LDC 10 to convert the output voltage into an appropriate scale acceptable by the LDC controller 30 or the PWM driver 40. The voltage sensing circuit 20 may employ resistances for voltage division and thus an error may be generated in a voltage sensing value fed back to the LDC controller 30 or the PWM driver 40 due to an error caused by the resistances. The LDC controller 30 may output a PWM signal having a duty as a signal that indicates a voltage reference value. The LDC controller 30 may include a voltage reference map having predetermined duties that correspond to a plurality of voltage reference values.

Figure 2:
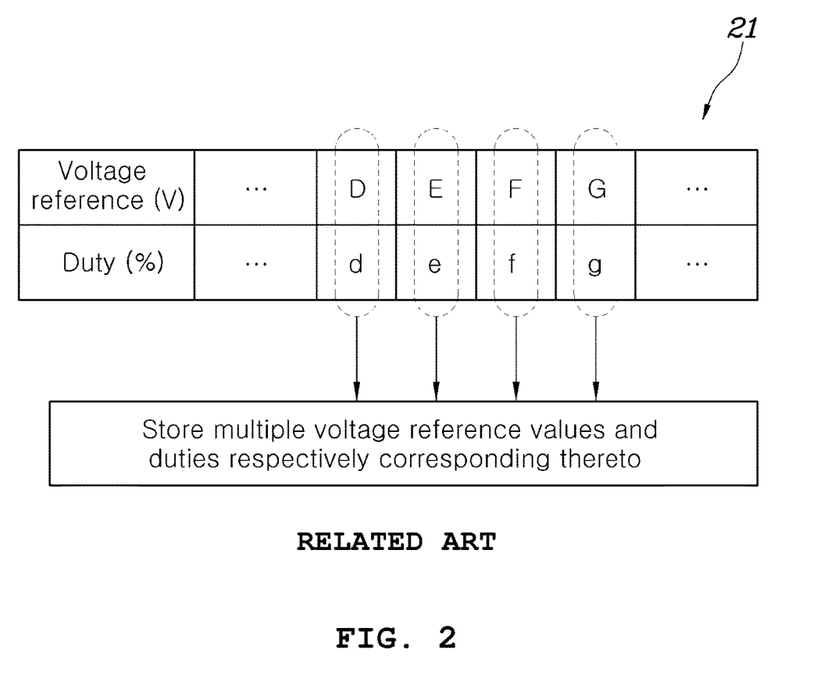
FIG. 2 illustrates an exemplary a voltage reference map included in an LDC controller constituting a conventional LDC control system according to the related art.

FIG. 2 illustrates an exemplary voltage reference map included in a conventional LDC controller according to the related art. Referring to FIG. 2, a voltage reference map 21 may be implemented such that a plurality of voltage reference values and duties corresponding thereto are predetermined and stored therein. For example, the LDC controller 10 outputs a PWM signal having a duty of "d (in %)" corresponding to a voltage reference value of "D (in V)" in order to control the LDC 10 with the voltage reference value of "D (in V)".

The PWM signal having a duty, output from the LDC controller 30, is converted into a DC level through a smoothing circuit 50 and then input to the PWM driver 40 for performing analog control. The PWM driver 40 may be implemented as an analog IC performing analog control. The PWM driver 40 receives a smoothed voltage reference value and a voltage sensing value sensed by the output voltage sensing circuit and drives a switching element included in the LDC 10 to follow the voltage sensing value with the voltage reference value. The PWM driver 40 may include a circuit for scaling the smoothed voltage reference value to provide substantially the same scale to the smoothed voltage reference value as the output voltage sensing value divided and input to the PWM driver 40 and a circuit to match the output voltage sensing value input thereto and the scaled voltage reference value.

To improve output voltage control accuracy in the aforementioned LDC control system, additional costs and efforts are required to modify the voltage sensing circuit 20. Accordingly, a method of adjusting an output voltage sensing error of an LDC according to embodiments of the present invention compensates for an error generated in the voltage sensing circuit 20 by correcting a voltage reference map included in the LDC controller 30 without modifying the voltage sensing circuit 20. Accordingly, the output voltage of the LDC 10 may accurately follow the voltage reference value output from the LDC controller 30 to improve the control accuracy.

Figure 3:
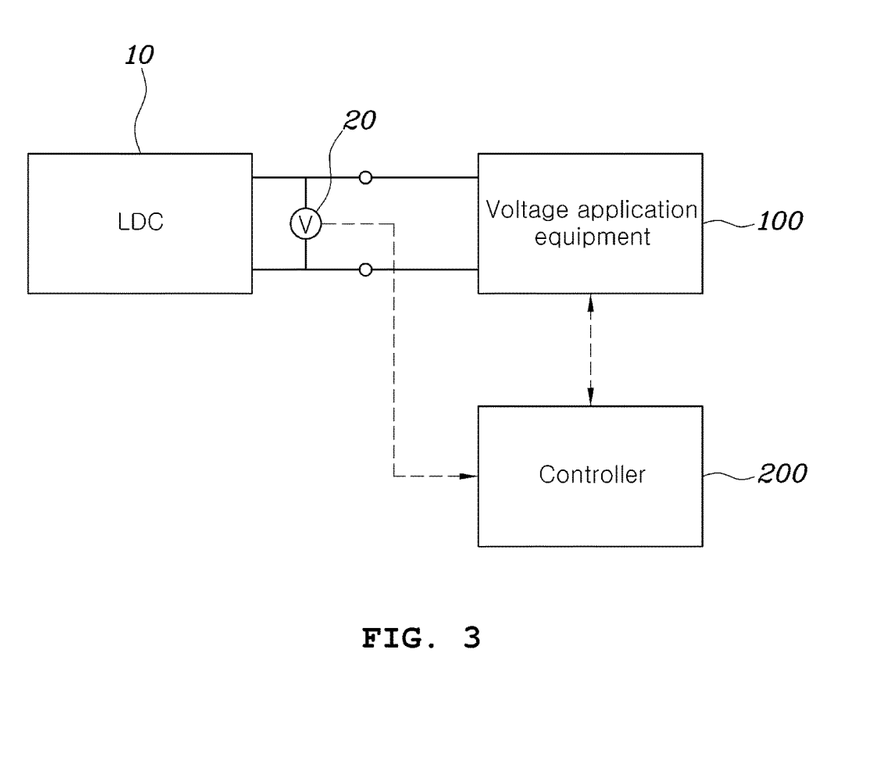
FIG. 3 is an exemplary block diagram of a system for implementing a method of correcting an output voltage sensing error of an LDC according to an exemplary embodiment of the present invention.

FIG. 3 is an exemplary block diagram of a system for implementing a method of adjustment of an output voltage sensing error of an LDC according to an exemplary embodiment of the present invention. Referring to FIG. 3, the system for implementing a method of correcting an output voltage sensing error of an LDC according to an embodiment of the present invention may include voltage application equipment 100 configured to apply a test voltage to an output of the LDC 10 and a controller 200 configured to compare the voltage of the output of the LDC 10, sensed by the voltage sensing circuit 20 provided to the output of the LDC 10. In other words, a sensing voltage with the test voltage and correcting a voltage reference map may be used to control the LDC 10 based on an error that corresponds to the comparison result.

The voltage application equipment 100 may be an element that applies the test voltage to the output of the LDC 10 according to an instruction of the controller 200 to check error in the voltage sensing circuit 20 provided to the output of the LDC 10. The controller 200 may be configured to adjust the operation of the voltage application equipment 100, compare the test voltage applied by the voltage application equipment 100 to the output of the LDC 10 with the voltage sensing value sensed by the voltage sensing circuit 20 to generate a correction value for sensing error correction and adjust the voltage reference map applied to a car for LDC control.

Figure 4:
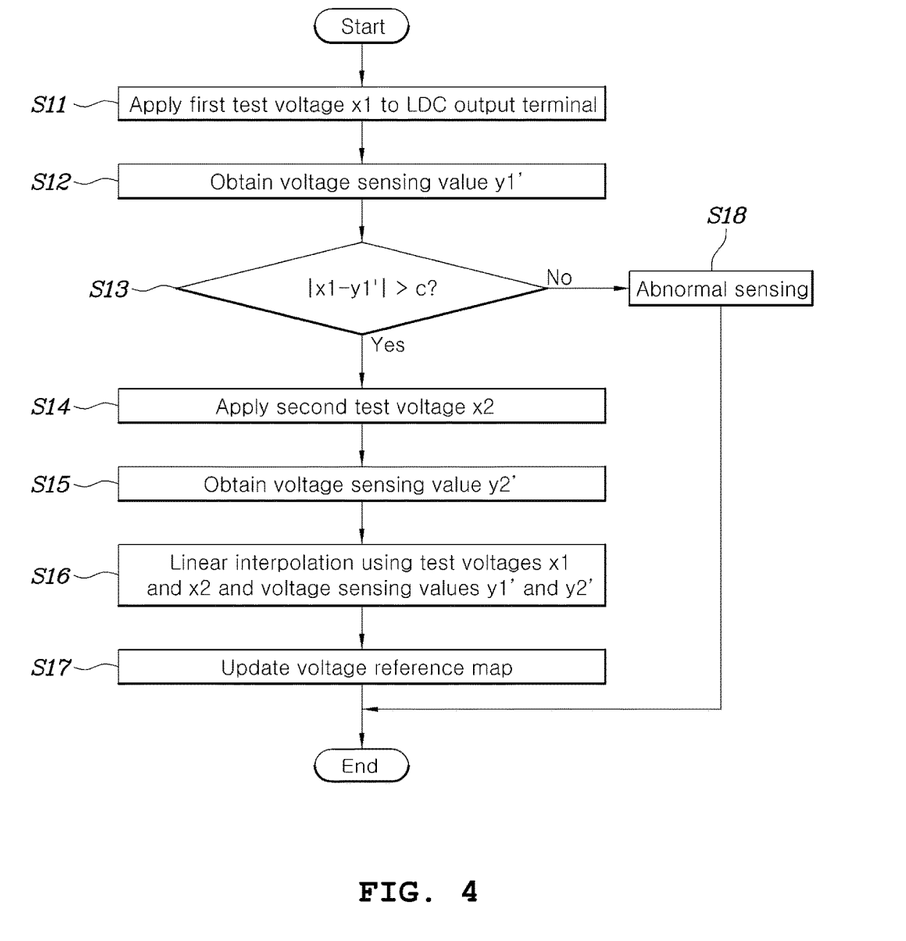
FIG. 4 is an exemplary flowchart illustrating a method of correcting an output voltage sensing error of an LDC according to an exemplary embodiment of the present invention.

While FIG. 3 shows the voltage application equipment 100 and the controller 200 as separate elements, the voltage application equipment 100 and the controller 200 may be implemented as one device. FIG. 4 is an exemplary flowchart illustrating a method of adjusting an output voltage sensing error of an LDC according to an exemplary embodiment of the present invention, which is implemented by the system shown in FIG. 3.

Referring to FIG. 4, the method of adjusting an output voltage sensing error of the LDC 10 according to an exemplary embodiment of the present invention may include an applying a test voltage to the output of the LDC 10 (step S1) using the voltage application equipment (shown in FIG. 1). Then sensing the voltage of the output of the LDC 10 (S12 and S14) which may include the voltage sensing circuit 20 (shown in FIG. 1) provided to the output of the LDC 10. and steps S16 and S17 may include Next, adjusting a voltage reference map included in the LDC controller 30 via the controller 200 (shown in FIG. 3) (shown in FIG. 1) to output a voltage reference value of the LDC 10 based on an error between the test voltage applied by the voltage application equipment 100 and the voltage sensing value sensed by the voltage sensing circuit 20.

In the method of adjusting an output voltage sensing error of the LDC 10 according to an exemplary embodiment of the present invention, to detect whether the voltage sensing circuit 20 normally (e.g., without error) operates before correction of the voltage reference map, the voltage application equipment 100 may be configured to apply the test voltage xl according to an instruction of the controller 200. The controller 200 may be configured to compare an error between the test voltage xl and a voltage sensing value y1' obtained by sensing the test voltage xl with a predetermined reference value c (S13). The controller may be configured to determine that the voltage sensing circuit 20 abnormally operates when the error is greater or smaller than the predetermined reference value c (S18) and finish the process of adjusting an output voltage sensing error of the LDC.

In an exemplary embodiment of the present invention, linear interpolation may be applied to determine output characteristics of the voltage sensing circuit 20 having an error. In other words, the voltage application equipment 100 may be configured to apply a first test voltage xl and a second test voltage x2 having different values to the output of the LDC 10 (S11 and S14). The first test voltage x1 and the second test voltage x2 may be respectively sensed (S12 and S15). In particular, step S13 in which the controller 200 may be configured to compare an error with respect to the voltage sensing value y1' with the predetermined reference value c may be performed after applying the first test voltage x1 and detecting the same (S11 and S12).

When an error between the first test voltage x1 and the voltage sensing value y1' obtained by sensing the first test voltage x1 is less than the predetermined reference value, the second test voltage x2 may be applied and detected (S14 and S15). Subsequently, the controller 200 may be configured to determine the output characteristics of the voltage sensing circuit 20 through linear interpolation using the first and second test voltages x1 and x2 and voltage sensing values y1' and y2' obtained by respectively detecting the first and second test voltages x1 and x2 (S16).

Figure 5:
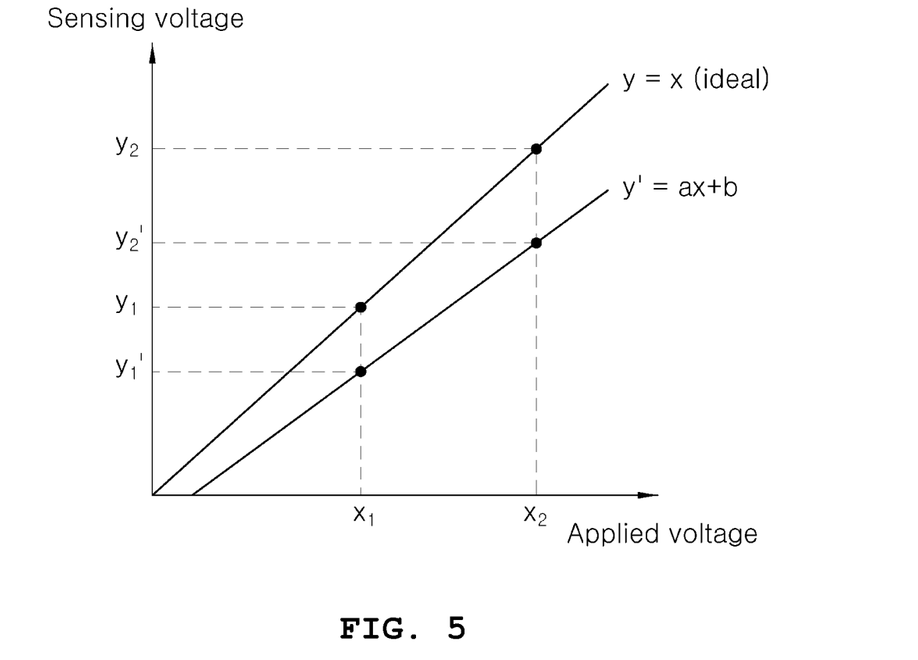
FIG. 5 is an exemplary view for explaining linear interpolation applied to determine output characteristics of a voltage sensing circuit in the method of correcting an output voltage sensing error of an LDC according to an exemplary embodiment of the present invention.

FIG. 5 is an exemplary view for explaining linear interpolation applied to determine the output characteristics of the voltage sensing circuit in the method of adjusting an output voltage sensing error of an LDC according to an exemplary embodiment of the present invention. The controller 200 may be configured to determine the output characteristics of the voltage sensing circuit as a linear equation, $y'=ax+b$, under the assumption that the output characteristics of the voltage sensing circuit are linear. The controller 200 may be configured to determine values a and b by substituting the first and second test voltages x1 and x2 and the voltage sensing values y1' and y2' obtained by respectively detecting the first and second test voltages x1 and x2 into the linear equation to obtain the solutions of simultaneous linear equations with two unknowns.

Thereafter, the controller 200 may be configured to determine a voltage reference correction value that may compensate for an error between output characteristics (y=x) when the voltage sensing circuit 20 correctly detects the voltages applied by the voltage application equipment 100, (i.e., when the applied voltages correspond to the voltage sensing values) and output characteristics ($y'=ax+b$) determined according to actual voltage application.

As shown in FIG. 5, since the voltage reference value that needs to be corrected corresponds to an error between an ideal voltage sensing value and an actual voltage sensing value, the voltage reference correction value may be determined as represented by Equation 1.

$$\Delta Vref = -(y-y') = (a-1)x + b \qquad \text{Equation 2}$$

When the voltage reference correction value is applied to actual vehicle driving, the voltage reference value may be output and applied to the voltage reference map of the LDC controller (30 of FIG. 1) to operate the LDC 10. As described above, the LDC controller 30 may be configured to output a PWM signal having a duty that corresponds to a voltage reference value and provide the PWM signal to the PWM driver 40 in analog control. Accordingly, in an exemplary embodiment of the present invention, the voltage reference map may be corrected by applying a PWM signal duty that corresponds to the voltage reference correction value thereto to update the voltage reference map (S17).

Figure 6:
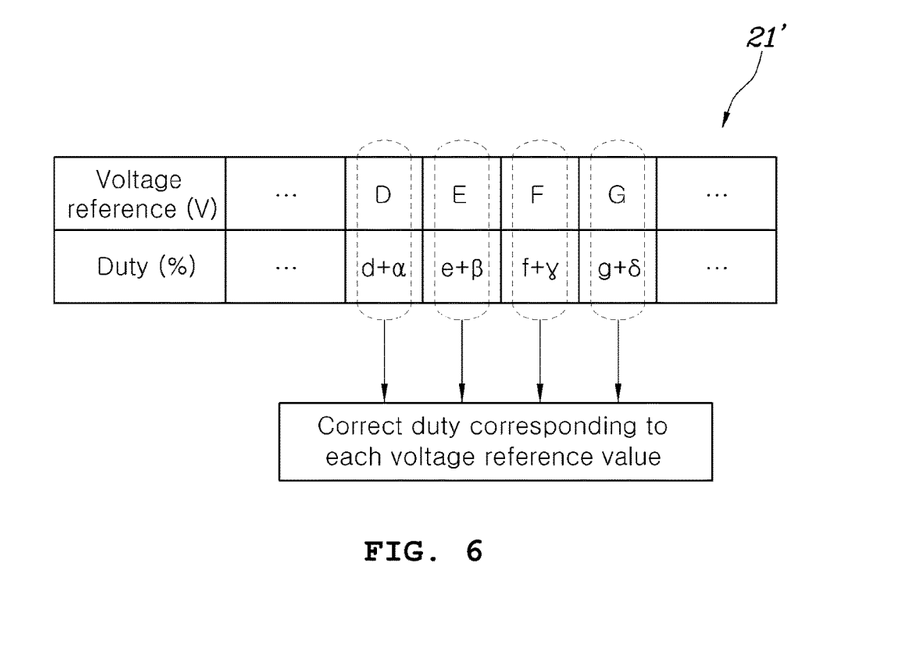
FIG. 6 illustrates an exemplary updated voltage reference map included in the LCD controller in the method of correcting an output voltage sensing error of an LDC according to an exemplary embodiment of the present invention.

FIG. 6 illustrates an example of an updated voltage reference map included in the LDC controller 30 in the method of adjusting an output voltage sensing error of an LDC according to an exemplary embodiment of the present invention. In step S17 shown in FIG. 4, the controller 200 may be configured to calculate duties α, β, γ and δ of a PWM signal, which respectively correspond to voltage reference correction values calculated according to Equation 1. The duties may be applied to the voltage reference map included in the LDC controller 30. The PWM signal duties that correspond to the voltage reference correction values may be derived based on experimental methods or theoretical calculation in consideration of system characteristics.

As shown in FIG. 6, the controller 200 may be configured to apply the PWM signal duties α, β, γ and δ respectively that correspond to the voltage reference correction values to voltage reference correction values to output PWM signal duties d, e, f and g of the LDC controller 30 determined respectively to correspond to voltage reference values, thereby deriving a new voltage reference map 21' to adjust an error in the voltage sensing circuit 20.

As described above, the method of adjusting an output voltage sensing error of an LDC according to exemplary embodiments of the present invention may adjust a sensing error generated in the voltage sensing circuit for sensing the output voltage of the LDC in a software manner without replacing or changing the hardware of the voltage sensing circuit. Accordingly, the method of adjusting an output voltage sensing error of an LDC according to exemplary embodiments of the present invention may improve control accuracy of the LDC without increasing costs and may meet various LDC control standards for hybrid and electric vehicles which are requested by many countries.

Although the exemplary embodiments of the present invention have been disclosed for illustrative purposes, those skilled in the art will appreciate that various modifications, additions and substitutions are possible, without departing from the scope and spirit of the invention as disclosed in the accompanying claims

What is claimed is:

1. A method of correcting an output voltage sensing error of a low voltage direct current to direct current (DC-DC) converter (LDC), comprising:
    applying a test voltage to an output of the LDC by a voltage application equipment;
    sensing a voltage of the output of the LCD using a voltage sensing circuit provided to the output of the LDC; and
    adjusting, by a controller a voltage reference map included in an LDC controller based on an error between the test voltage and a voltage sensing value sensed by the voltage sensing circuit, wherein the LDC controller outputs a voltage reference value of the LDC,
    wherein the applying of the test voltage includes applying a first test voltage and a second test voltage having different values to the output of the LDC using the voltage application equipment,
    wherein the sensing of the voltage of the output of the LDC includes sensing the first test voltage and the second test voltage by the voltage sensing circuit,
    wherein adjusting the voltage reference map includes determining output characteristics of the voltage sensing circuit by applying linear interpolation to the first and second test voltages and voltage sensing values obtained by sensing the first and second test voltages, and adjusting the voltage reference map based on the determined output characteristics of the voltage sensing circuit, and
    wherein the LDC controller is configured to output a PWM signal having a duty that corresponds to a voltage reference value with reference to the voltage reference map to adjust the LDC, wherein the voltage reference map is a data map configured to store the voltage reference value and the PWM signal duty that corresponds to the voltage reference value.

2. The method according to claim 1, further comprising:
comparing, by the controller the error between the test voltage and the voltage sensing value with a predetermined reference value; and
determining, by the controller that the voltage sensing circuit abnormally operates when the error is greater or smaller than the reference value.

3. The method according to claim 1, wherein the adjustment of the voltage reference map includes: adjusting the PWM signal duty that corresponds to the voltage reference value in the voltage reference map.

4. The method according to claim 1, wherein the correcting of the voltage reference map includes
calculating, by the controller an error between the determined output characteristics of the voltage sensing circuit and ideal output characteristics of the voltage sensing circuit to generate a voltage reference correction value, and
calculating, by the controller a duty correction value of the PWM signal, that corresponds to the voltage reference correction value, to correct the PWM signal duty that corresponds to the voltage reference value in the voltage reference map.

5. A method of correcting an output voltage sensing error of an LDC, comprising:
applying a first test voltage and a second test voltage having different values to an output of the LDC by a voltage application equipment;
sensing a voltage of the output of the LDC provided from a voltage sensing circuit;
determining, by a controller output characteristics of the voltage sensing circuit by applying linear interpolation to the first and second test voltages and voltage sensing values obtained by respectively sensing the first and second test voltages; and
adjusting, by the controller a voltage reference map included in an LDC controller based an error between the determined output characteristics of the voltage sensing circuit and ideal output characteristics of the voltage sensing circuit,
wherein the LDC controller outputs a voltage reference value of the LDC,
wherein the LDC controller is configured to output a PWM signal having a duty that corresponds to a voltage reference value with reference to the voltage reference map to adjust the LDC, and
wherein the voltage reference map is a data map configured to store the voltage reference value and the PWM signal duty that corresponds to the voltage reference value.

6. The method according to claim 5, wherein the correcting of the voltage reference map comprises:
calculating, by the controller an error between the determined output characteristics of the voltage sensing circuit and ideal output characteristics of the voltage sensing circuit to generate a voltage reference correction value; and
calculating, by the controller a duty correction value of the PWM signal, that corresponds to the voltage reference correction value, to adjust the PWM signal duty that corresponds to the voltage reference value in the voltage reference map.

7. A system of correcting an output voltage sensing error of a low voltage DC-DC converter (LDC) comprising:
voltage application equipment configured to apply a test voltage to an output of the LDC;
a voltage sensing circuit provided to the output of the LDC to sense a voltage of the output of the LDC; and
a controller configured to adjust a voltage reference map included in an LDC controller based on an error between the test voltage and a voltage sensing value sensed by the voltage sensing circuit,
wherein the LDC controller is configured to output a voltage reference value of the LDC,
wherein the test voltage includes a first test voltage and a second test voltage having different values,
wherein the voltage sensing circuit is configured to sense the first test voltage and the second test voltage,
wherein the controller is configured to determine output characteristics of the voltage sensing circuit by applying linear interpolation to the first and second test voltages and voltage sensing values obtained by sensing the first and second test voltages, and adjust the voltage reference map based on the determined output characteristics of the voltage sensing circuit, and
wherein the LDC controller is configured to output a PWM signal having a duty that corresponds to a voltage reference value with reference to the voltage reference map to adjust the LDC, wherein the voltage reference map is a data map configured to store the voltage reference value and the PWM signal duty that corresponds to the voltage reference value.

* * * * *